(12) United States Patent (10) Patent No.: US 10,597,774 B2
Mimoun et al. (45) Date of Patent: Mar. 24, 2020

(54) METHOD FOR PRODUCING A COATED SUBSTRATE

(71) Applicant: SAINT-GOBAIN GLASS FRANCE, Courbevoie (FR)

(72) Inventors: Emmanuel Mimoun, Paris (FR); Matthieu Bilaine, Paris (FR)

(73) Assignee: SAINT-GOBAIN GLASS FRANCE, Courbevoie (FR)

( * ) Notice: Subject to any disclaimer, the term of this patent is extended or adjusted under 35 U.S.C. 154(b) by 0 days.

(21) Appl. No.: 14/395,253

(22) PCT Filed: Apr. 15, 2013

(86) PCT No.: PCT/FR2013/050813
§ 371 (c)(1),
(2) Date: Oct. 17, 2014

(87) PCT Pub. No.: WO2013/156721
PCT Pub. Date: Oct. 24, 2013

(65) Prior Publication Data
US 2015/0072084 A1 Mar. 12, 2015

(30) Foreign Application Priority Data

Apr. 17, 2012 (FR) ...................................... 12 53524

(51) Int. Cl.
| | | |
|---|---|---|
| *C23C 14/58* | (2006.01) | |
| *B23K 26/073* | (2006.01) | |
| *C03C 17/36* | (2006.01) | |
| *B23K 26/352* | (2014.01) | |
| *H01B 5/14* | (2006.01) | |
| *H01B 13/00* | (2006.01) | |
| *B23K 26/00* | (2014.01) | |
| *B23K 26/354* | (2014.01) | |
| *B23K 26/08* | (2014.01) | |
| *B23K 103/00* | (2006.01) | |

(52) U.S. Cl.
CPC ...... *C23C 14/5813* (2013.01); *B23K 26/0006* (2013.01); *B23K 26/0738* (2013.01); *B23K 26/08* (2013.01); *B23K 26/352* (2015.10); *B23K 26/354* (2015.10); *C03C 17/36* (2013.01); *C03C 17/366* (2013.01); *C03C 17/3626* (2013.01); *C03C 17/3644* (2013.01); *H01B 5/14* (2013.01); *H01B 13/003* (2013.01); *H01B 13/0026* (2013.01); *B23K 2103/56* (2018.08); *C03C 2218/32* (2013.01)

(58) Field of Classification Search
None
See application file for complete search history.

(56) References Cited

U.S. PATENT DOCUMENTS

| | | | | |
|---|---|---|---|---|
| 3,614,456 | A | * 10/1971 | Hamisch | ................ B23K 26/04 250/234 |
| 6,353,218 | B1 | * 3/2002 | Yamazaki | .......... B23K 26/0604 250/216 |
| 2004/0053476 | A1 | 3/2004 | Sotani et al. | |
| 2004/0241922 | A1 | 12/2004 | Toida | |
| 2005/0036190 | A1 | * 2/2005 | Tanaka | ................. G02B 26/105 359/212.1 |
| 2012/0087005 | A1 | 4/2012 | Reymond et al. | |
| 2012/0120483 | A1 | * 5/2012 | Tagliaferri | ........... B23K 26/046 359/356 |
| 2012/0171439 | A1 | * 7/2012 | Kharchenko | ......... C03C 17/002 428/209 |
| 2012/0325784 | A1 | * 12/2012 | Moffatt | ................. B23K 26/03 219/121.61 |

FOREIGN PATENT DOCUMENTS

| | | |
|---|---|---|
| CN | 1638022 A | 7/2005 |
| JP | 2004-111584 | 4/2004 |
| WO | WO 2010/115558 A1 | 10/2010 |

(Continued)

OTHER PUBLICATIONS

Beam Parameter Product. RP Photonics Encyclopedia, www.rp-phtonics.com.*

(Continued)

*Primary Examiner* — Jose Hernandez-Kenney
(74) *Attorney, Agent, or Firm* — Oblon, McClelland, Maier & Neustadt, L.L.P.

(57) ABSTRACT

The subject of the invention is a process for obtaining a substrate provided on at least one portion of at least one of its sides with a coating, comprising a step of depositing said coating on said substrate, then a step of heat treatment of said coating using a pulsed or continuous laser radiation focused on said coating in the form of at least one laser line, the wavelength of which is within a range extending from 400 to 1500 nm, said heat treatment being such that a relative displacement movement is created between the substrate and the or each laser line, the speed of which is at least 3 meters per minute, the or each laser line having a beam quality factor (BPP) of at most 3 mm·mrad and, measured at the place where the or each laser line is focused on said coating, a linear power density divided by the square root of the duty cycle of at least 200 W/cm, a length of at least 20 mm and a width distribution along the or each line such that the mean width is at least 30 micrometers and the difference between the largest width and the smallest width is at most 15% of the value of the mean width.

22 Claims, No Drawings

(56) References Cited

FOREIGN PATENT DOCUMENTS

| WO | WO 2010/142926 A1 | 12/2010 | | |
|---|---|---|---|---|
| WO | WO 2011/039488 A1 | 4/2011 | | |
| WO | WO 2011038488 A1 * | 4/2011 | ............. | G06F 3/038 |

OTHER PUBLICATIONS

Beam Quality . RP Photonics Encyclopedia, www.rp-phtonics.com.*
Coherent. "Understanding Laser Beam Parameters Leads to Better System Performance and Can Save Money" (Jun. 11, 2007), found at http://www.coherent.com/downloads/understandinglaserbeamparameters.pdf.*
"Undulation." Merriam-Webster.com. Accessed Aug. 13, 2018. https://www.merriam-webster.com/dictionary/undulation (Year: 2018).*
International Search Report dated Jul. 24, 2013, in PCT/FR13/50813 filed Apr. 15, 2013.

* cited by examiner

METHOD FOR PRODUCING A COATED SUBSTRATE

The invention relates to the heat treatment of substrates provided with coatings using a laser radiation.

It is known in the microelectronics field to heat treat coatings (for example made of silicon) deposited on substrates using focused laser lines, typically excimer lasers that emit in the ultraviolet. These processes are commonly used for obtaining polycrystalline silicon from amorphous silicon, by local melting of the silicon and recrystallization on cooling. Conventionally, the excellent flatness of the substrates used in microelectronics, their small size, and the industrial environment typical in this type of industry make it possible to position the substrate very accurately in the laser focal spot in order to treat the whole of the substrate homogeneously and optimally. The slow treatment speeds allow the use, for the displacement of the substrates, of air-cushion table systems. If necessary, systems that make it possible to control the position of the substrate with respect to the laser focal spot may correct possible flatness defects or the presence of low-frequency vibrations. The control systems are compatible with the slow treatment speeds used.

Laser treatments are now used to heat treat layers on glass or a polymeric organic substrate for various industrial applications: mention may be made, by way of example, of the production of self-cleaning glazing comprising $TiO_2$-based coatings, the production of low-emissivity glazing containing a glass substrate coated with a multilayer stack comprising at least one silver layer, described in application WO 2010/142926, or the production of large-sized substrates for photovoltaic cells comprising transparent and conductive (TCO) thin films, described in application WO 2010/139908.

The industrial and economic context here is totally different. Typically, the substrates to be treated may be large sheets of glass, the surface area of which is of the order of $6*3$ m², therefore the flatness of which cannot be controlled accurately (for example to within ±1 mm), moved at high speed (sometimes of the order of 10 m/minute or more) on industrial conveyors on exiting deposition machines (for example sputtering deposition machines), therefore in an industrial environment that generates vibrations which may be large. Therefore, the position of each point of the coating to be treated with respect to the focal plane of the laser may vary significantly, resulting in large treatment heterogeneities. The high speeds of travel of the substrates make it extremely tricky or even impossible to put in place systems for mechanically controlling the position of the substrate.

There is therefore a need to provide a laser treatment process that makes it possible to treat substrates having flatness defects economically, homogeneously and at high speed in a challenging industrial environment.

For this purpose, one subject of the invention is a process for obtaining a substrate provided on at least one portion of at least one of its sides with a coating, comprising a step of depositing said coating on said substrate, then a step of heat treatment of said coating using a pulsed or continuous laser radiation focused on said coating in the form of at least one laser line, the wavelength of which is within a range extending from 400 to 1500 nm, said heat treatment being such that a relative displacement movement is created between the substrate and the or each laser line, the speed of which is at least 3 meters per minute, the or each laser line having a beam quality factor (BPP) of at most 3 mm·mrad and, measured at the place where the or each laser line is focused on said coating, a linear power density divided by the square root of the duty cycle of at least 200 W/cm, a length of at least 20 mm and a width distribution along the or each line such that the mean width is at least 30 micrometers and the difference between the largest width and the smallest width is at most 15% of the value of the mean width.

Another subject of the invention is a device for the heat treatment of a coating deposited on a substrate, using a pulsed or continuous laser radiation, the wavelength of which is within a range extending from 400 to 1500 nm, focused on said coating in the form of at least one line, comprising:
  one or more laser sources and also forming and redirecting optics capable of generating at least one laser line able to exhibit, in operation, a beam quality factor (BPP) of at most 3 mm·mrad and, measured at the place where the or each laser line is focused on said coating, a linear power density divided by the square root of the duty cycle of at least 200 W/cm, a length of at least 20 mm and a width distribution along the or each line such that the mean width is at least 30 micrometers and the difference between the largest width and the smallest width is at most 15% of the value of the mean width, and
  displacement means capable of creating, in operation, a relative displacement movement between the substrate and the or each laser line, the speed of which is at least 3 meters per minute.

The inventors have been able to demonstrate that the combined choice of a suitable wavelength, a suitable beam quality factor, a suitable linear power density and a suitable laser line width made it possible to treat the substrates homogeneously, while tolerating large variations of distance with respect to the laser focal spot. A homogeneous treatment is understood to mean a treatment such that the temperature reached at each point during the treatment does not vary by more than 15%, in particular 10%, or even 5% in relative terms with respect to the targeted temperature. In this way, the properties obtained (resistivity, emissivity, photocatalytic activity, visual appearance in reflection or absorption, depending on the type of layers treated) are remarkably homogeneous over the entire surface of the substrate. Advantageously, and owing to the aforementioned choice, the width of the or each laser line and/or the temperature reached by the coating vary by at most 10% in relative terms when the distance from the coating to the focal plane of the laser varies by ±1 mm.

Preferably, the substrate, which is generally substantially horizontal, travels on a conveyor facing the or each laser line, the or each laser line being fixed and positioned substantially perpendicular to the direction of travel. The or each laser line may be positioned above and/or below the substrate.

Other embodiments are of course possible. For example, the substrate may be fixed, the or each laser line being moved opposite the substrate, in particular using a mobile gantry. The or each laser line may also not be positioned perpendicular to the direction of travel, but askew, at any angle possible. The substrate may also be moved over a plane which is not horizontal, but vertical, or along any possible orientation.

The laser radiation is preferably generated by modules comprising one or more laser sources and also forming and redirecting optics.

The laser sources are typically laser diodes or fiber lasers. Laser diodes make it possible to economically achieve high power densities with respect to the electrical supply power for a small space requirement. The space requirement of fiber lasers is even smaller, and the linear power density obtained may be even higher, for a cost that is however greater.

The radiation resulting from the laser sources may be continuous or pulsed, preferably continuous. As is customary, the duty cycle is defined as being the ratio between the duration of a laser pulse and the time between two successive pulses. When the radiation is continuous, the duty cycle is equal to 1, so that the linear power density divided by the square root of the duty cycle is equal to the linear power density. When the radiation is pulsed, the repetition frequency is advantageously at least 10 kHz, in particular 15 kHz and even 20 kHz so as to be compatible with the high speeds of travel used.

The wavelength of the radiation of the or each laser line is preferably within a range extending from 800 to 1100 nm, in particular from 800 to 1000 nm. High-power laser diodes that emit at a wavelength chosen from 808 nm, 880 nm, 915 nm, 940 nm or 980 nm have proved particularly suitable.

The forming and redirecting optics preferably comprise lenses and mirrors, and are used as means for positioning, homogenizing and focusing the radiation.

The purpose of the positioning means is, where appropriate, to arrange the radiation emitted by the laser sources along a line. They preferably comprise mirrors. The purpose of the homogenization means is to superpose the spatial profiles of the laser sources in order to obtain a homogeneous linear power density along the whole of the line. The homogenization means preferably comprise lenses that enable the separation of the incident beams into secondary beams and the recombination of said secondary beams into a homogeneous line. The radiation-focusing means make it possible to focus the radiation on the coating to be treated, in the form of a line of desired length and width. The focusing means preferably comprise a convergent lens.

The term "length" of the line is understood to mean the largest dimension of the line, measured on the surface of the coating, and the term "width" is understood to mean the dimension in a direction transverse to the direction of the largest dimension. As is customary in the field of lasers, the width w of the line corresponds to the distance (along this transverse direction) between the axis of the beam (where the intensity of the radiation is at a maximum) and the point where the intensity of the radiation is equal to $1/e^2$ times the maximum intensity. If the longitudinal axis of the laser line is referred to as x, it is possible to define a width distribution along this axis, referred to as w(x).

The mean width of the or each laser line is preferably at least 35 micrometers, in particular within a range extending from 40 to 100 micrometers or from 40 to 70 micrometers. Throughout the present text the term "mean" is understood to mean the arithmetic mean. Over the entire length of the line, the width distribution is narrow in order to avoid any treatment heterogeneity. Thus, the difference between the largest width and the smallest width is preferably at most 10% of the value of the mean width. This number is preferably at most 5% and even 3%.

The length of the or each laser line is preferably at least 10 cm or 20 cm, in particular within a range extending from 20 or 30 to 100 cm, in particular from 20 or 30 to 75 cm, or even from 20 or 30 to 60 cm.

The forming and redirecting optics, in particular the positioning means, may be adjusted manually or with the aid of actuators that make it possible to adjust their positioning remotely. These actuators (typically piezoelectric motors or blocks) may be controlled manually and/or be adjusted automatically. In the latter case, the actuators will preferably be connected to detectors and also to a feedback loop.

At least part of the laser modules, or even all of them, is preferably arranged in a leaktight box, which is advantageously cooled, and especially ventilated, so as to ensure their heat stability.

The laser modules are preferably mounted on a rigid structure referred to as a "bridge", based on metallic elements, typically made of aluminum. The structure preferably does not comprise a marble slab. The bridge is preferably positioned parallel to the conveying means so that the focal plane of the or each laser line remains parallel to the surface of the substrate to be treated. Preferably, the bridge comprises at least four feet, the height of which can be individually adjusted in order to ensure a parallel positioning in all circumstances. The adjustment may be provided by motors located at each foot, either manually or automatically, in connection with a distance sensor. The height of the bridge may be adapted (manually or automatically), in order to take into account the thickness of the substrate to be treated, and to thus ensure that the plane of the substrate coincides with the focal plane of the or each laser line.

The linear power density divided by the square root of the duty cycle is preferably at least 300 W/cm, advantageously 350 or 400 W/cm, in particular 450 W/cm, or 500 W/cm and even 550 W/cm. The linear power density divided by the square root of the duty cycle is even advantageously at least 600 W/cm, in particular 800 W/cm, or even 1000 W/cm. When the laser radiation is continuous, the duty cycle is equal to 1, so that this number corresponds to the linear power density. The linear power density is measured at the place where the or each laser line is focused on the coating. It may be measured by placing a power detector along the line, for example a calorimetric power meter, such as in particular the Beam Finder S/N 2000716 power meter from the company Coherent Inc. The power is advantageously distributed homogeneously over the entire length of the or each line. Preferably, the difference between the highest power and the lowest power is equal to less than 10% of the mean power.

The energy density provided to the coating divided by the square root of the duty cycle is preferably at least 20 J/cm², or even 30 J/cm². Here too, the duty cycle is equal to 1 when the laser radiation is continuous.

The beam quality factor, frequently referred to as beam parameter product or BPP, corresponds to the product of the mean width of the line and its divergence. The beam quality factor is preferably at most 2.6 mm·mrad, in particular 2 mm·mrad, or even 1.5 or 1 mm·mrad. According to certain embodiments, the beam quality factor is at most 0.7 mm·mrad, in particular 0.6 mm·mrad, and even 0.5 mm·mrad, or even 0.4 mm·mrad or else 0.3 mm·mrad.

The heat treatment according to the invention is particularly well suited to the treatment of layers that are weakly absorbent at the wavelength of the laser. The absorption of the coating at the wavelength of the laser is preferably at least 5%, in particular 10%. It is advantageously at most 90%, in particular 80% or 70%, or even 60% or 50%, and even 40% or else 30%.

The temperature to which the coating is subjected during the heat treatment is preferably at least 300° C., in particular 350° C., or even 400° C.

Preferably, the temperature of the substrate on the side opposite the coated side does not exceed 100° C., in particular 50° C. and even 30° C. during the heat treatment.

When several laser lines are used, it is preferable that they are positioned so that the entire surface area of the multilayer stack is treated. The or each line is preferably positioned perpendicular to the run direction of the substrate, or positioned obliquely. The various lines may treat the substrate simultaneously, or in a time-staggered manner. The important thing is that the entire surface area is treated.

The laser radiation is partly reflected by the coating to be treated and partly transmitted through the substrate. For safety reasons, it is preferable to place radiation-stopping means in the path of these reflected and/or transmitted radiations. These radiation-stopping means will typically be metal boxes cooled by circulation of fluid, in particular water. To prevent the reflected radiation from damaging the laser modules, the axis of propagation of the or each laser line forms a preferably non-zero angle with the normal to the substrate, typically an angle between 5° and 20°.

In order to improve the effectiveness of the treatment, it is preferable for at least one portion of the (main) laser radiation transmitted through the substrate and/or reflected by the coating to be redirected in the direction of said substrate in order to form at least one secondary laser radiation, which preferably impacts the substrate at the same location as the main laser radiation, advantageously with the same focus depth and the same profile. The formation of the or each secondary laser radiation advantageously uses an optical assembly comprising only optical elements selected from mirrors, prisms and lenses, in particular an optical assembly consisting of two mirrors and a lens, or of a prism and a lens. By recovering at least one portion of the main radiation lost and by redirecting it toward the substrate, the heat treatment is considerably improved. The choice of using the portion of the main radiation transmitted through the substrate ("transmission" mode) or the portion of the main radiation reflected by the coating ("reflection" mode), or optionally of using both, depends on the nature of the layer and on the wavelength of the laser radiation.

When the substrate is moving, in particular translationally, it may be moved using any mechanical conveying means, for example using belts, rollers or trays running translationally. The conveying system makes it possible to control and regulate the run speed. The conveying means preferably comprises a rigid chassis and a plurality of rollers. The pitch of the rollers is advantageously within a range extending from 50 to 300 mm. The rollers preferably comprise metal rings, typically made of steel, covered with plastic wrappings. The rollers are preferably mounted on bearings with reduced clearance, typically in a proportion of three rollers per bearing. In order to ensure a perfect flatness of the conveying plane, the positioning of each of the rollers is advantageously adjustable. The rollers are preferably moved using pinions or chains, preferably tangential chains, driven by at least one motor.

The conveying means are preferably such that at the or each laser line, the absolute value of the distance between each point of the substrate and the focal plane of the or each laser line is at most 1 mm, in particular 0.5 mm, or even 0.3 mm and even 0.1 mm.

If the substrate is made of a flexible polymeric organic material, it may be moved using a film advance system in the form of a succession of rollers. In this case, the flatness may be ensured by an appropriate choice of the distance between the rollers, taking into account the thickness of the substrate (and therefore its flexibility) and the impact that the heat treatment may have on the creation of a possible sag.

When the laser line is moving, it is necessary to provide a system for moving the laser modules (laser sources and forming and redirecting optics), located above or beneath the substrate. The treatment time is regulated by the run speed of the laser line. The laser modules may be moved, for example using a robot, in any direction, allowing, where appropriate, a treatment of curved substrates, such as for example, curved glass substrates.

The speed of the relative displacement movement between the substrate and the or each laser line is advantageously at least 4 m/min, in particular 5 m/min and even 6 m/min or 7 m/min, or else 8 m/min and even 9 m/min or 10 m/min. According to certain embodiments, in particular when the absorption of the coating at the length of the laser is high or when the coating may be deposited with high deposition rates, the speed of the relative displacement movement between the substrate and the or each laser line is at least 12 m/min or 15 m/min, in particular 20 m/min and even 25 or 30 m/min. In order to ensure a treatment that is as homogeneous as possible, the speed of the relative displacement movement between the substrate and the or each laser line varies during the treatment by at most 10% in relative terms, in particular 2% and even 1% with respect to its nominal value.

Of course, all relative positions of the substrate and the laser are possible provided that the surface of the substrate can be suitably irradiated. More generally, the substrate will be positioned horizontally or substantially horizontally, but it may also be positioned vertically, or at any possible inclination. When the substrate is positioned horizontally, the laser sources are generally positioned so as to irradiate the top side of the substrate. The laser sources may also irradiate the underside of the substrate. In this case, it is necessary for the substrate support system, optionally the substrate conveying system when the substrate is moving, to let the radiation pass into the zone to be irradiated. This is the case for example when conveying rollers are used: since the rollers are not connected, it is possible to position the laser sources in a zone located between two successive rollers.

When both sides of the substrate are to be treated, it is possible to use several laser sources located on either side of the substrate, whether the latter is in a horizontal, vertical or any inclined position. These laser sources may be identical or different, in particular their wavelengths may be different, especially adapted to each of the coatings to be treated. By way of example, a first coating (for example low-emissivity coating) located on a first side of the substrate may be treated by a first laser radiation that emits for example in the visible or near infrared whilst a second coating (for example a photocatalytic coating) located on the second side of said substrate may be treated by a second laser radiation, that emits for example in the infrared.

The heat treatment device according to the invention may be integrated into a layer deposition line, for example a magnetron sputtering deposition line, a chemical vapor deposition (CVD) line, in particular a plasma-enhanced (PECVD) line, under vacuum or at atmospheric pressure (APPECVD). In general, the line includes substrate handling devices, a deposition unit, optical control devices and stacking devices. For example, the substrates run on conveyor rollers, in succession past each device or each unit.

The heat treatment device according to the invention is preferably located just after the coating deposition unit, for example at the exit of the deposition unit. The coated substrate may thus be treated in line after the coating has been deposited, at the exit of the deposition unit and before the optical control devices, or after the optical control devices and before the substrate stacking devices.

The heat treatment device may also be integrated into the deposition unit. For example, the laser may be introduced into one of the chambers of a sputtering deposition unit, especially into a chamber in which the atmosphere is rarefied, especially at a pressure between $10^{-6}$ mbar and $10^{-2}$ mbar. The heat treatment device may also be placed outside the deposition unit, but so as to treat a substrate located inside said unit. For this purpose, all that is required is to provide a window transparent to the wavelength of the radiation used, through which the laser radiation passes to treat the layer. It is thus possible to treat a layer (for example a silver layer) before the subsequent deposition of another layer in the same unit.

Whether the heat treatment device is outside the deposition unit or integrated thereinto, these "in-line" processes are preferable to a process involving off-line operations, in which it would be necessary to stack the glass substrates between the deposition step and the heat treatment.

However, processes involving off-line operations may have an advantage in cases in which the heat treatment according to the invention is carried out in a place different from that where the deposition is carried out, for example in a place where conversion of the glass takes place. The heat treatment device may therefore be integrated into lines other than the layer deposition line. For example, it may be integrated into a multiple glazing (especially double or triple glazing) manufacturing line or into a laminated glazing manufacturing line, or else into a curved and/or tempered glazing manufacturing line. The laminated or curved or tempered glazing may be used both as architectural glazing or motor vehicle glazing. In these various cases, the heat treatment according to the invention is preferably carried out before the multiple glazing or laminated glazing is produced. However, the heat treatment may be carried out after the double glazing or laminated glazing is produced.

The heat treatment device is preferably positioned in a closed chamber that makes it possible to protect people by preventing any contact with the laser radiation and to prevent any pollution, in particular of the substrate, optics or treatment zone.

The multilayer stack may be deposited on the substrate by any type of process, in particular processes generating predominantly amorphous or nanocrystalline layers, such as the sputtering, especially magnetron sputtering, process, the plasma-enhanced chemical vapor deposition (PECVD) process, the vacuum evaporation process or the sol-gel process.

Preferably, the multilayer stack is deposited by sputtering, especially magnetron sputtering.

For greater simplicity, the heat treatment of the multilayer stack preferably takes place in air and/or at atmospheric pressure. However, it is possible for the heat treatment of the multilayer stack to be carried out within the actual vacuum deposition chamber, for example before a subsequent deposition.

The substrate is preferably made of glass or of a polymeric organic material. It is preferably transparent, colorless (it is then a clear or extra-clear glass) or colored, for example blue, grey, green or bronze. The glass is preferably of soda-lime-silica type, but it may also be glass of borosilicate or alumino-borosilicate type. The preferred polymeric organic materials are polycarbonate, polymethyl methacrylate, polyethylene terephthalate (PET), polyethylene naphthalate (PEN), or else fluoropolymers such as ethylene tetrafluoroethylene (ETFE). The substrate advantageously has at least one dimension greater than or equal to 1 m, or 2 m and even 3 m. The thickness of the substrate generally varies between 0.5 mm and 19 mm, preferably between 0.7 and 9 mm, in particular between 2 and 8 mm, or between 4 and 6 mm. The substrate may be flat or curved, or even flexible.

The glass substrate is preferably of float glass type, that is to say capable of having been obtained by a process that consists in pouring the molten glass onto a bath of molten tin ("float" bath). In this case, the coating to be treated may equally be deposited on the "tin" side as on the "atmosphere" side of the substrate. The terms "atmosphere" and "tin" sides are understood to mean the sides of the substrate that have respectively been in contact with the atmosphere in the float bath and in contact with the molten tin. The tin side contains a small superficial amount of tin that has diffused into the structure of the glass. The glass substrate may also be obtained by rolling between two rolls, a technique that makes it possible in particular to imprint patterns onto the surface of the glass.

The heat treatment is preferably intended to improve the crystallization of the coating, in particular by an increase of the size of the crystals and/or of the amount of crystalline phase. The heat treatment may also be intended to oxidize a layer of a metal or of a metal oxide that is sub-stoichiometric in oxygen, optionally by promoting the growth of a particular crystalline phase.

Preferably, the heat treatment step does not use melting, even partial melting, of the coating. In the cases where the treatment is intended to improve the crystallization of the coating, the heat treatment makes it possible to provide sufficient energy to promote the crystallization of the coating by a physicochemical mechanism of crystalline growth around nuclei already present in the coating, while remaining in the solid phase. This treatment does not use a mechanism of crystallization by cooling starting from a molten material, on the one hand because that would require extremely high temperatures and, on the other hand, because that would be capable of modifying the thicknesses or the refractive indices of the coating, and therefore its properties, by modifying, for example, its optical appearance.

The treated coating preferably comprises a thin layer selected from metallic layers (in particular based on or consisting of silver or molybdenum), titanium oxide layers and transparent electrically conductive layers.

The transparent electrically conductive layers are typically based on mixed indium tin oxides (referred to as "ITOs"), based on mixed indium zinc oxides (referred to as "IZOs"), based on gallium-doped or aluminum-doped zinc oxide, based on niobium-doped titanium oxide, based on cadmium or zinc stannate, or based on tin oxide doped with fluorine and/or with antimony. These various layers have the distinctive feature of being layers that are transparent and nevertheless conductive or semiconductive, and are used in many systems where these two properties are necessary: liquid crystal displays (LCDs), solar or photovoltaic collectors, electrochromic or electro-luminescent devices (in particular LEDs, OLEDs), etc. Their thickness, generally driven by the desired sheet resistance, is typically between 50 and 1000 nm, limits included.

The thin metallic layers, for example based on metallic silver, but also based on metallic molybdenum or metallic niobium, have electrical conduction and infrared radiation reflection properties, hence their use in solar-control glazing, in particular solar-protection glazing (that aims to reduce the amount of incoming solar energy) or low-emissivity glazing (that aims to reduce the amount of energy dissipated to the outside of a building or a vehicle). Their physical thickness is typically between 4 and 20 nm (limits included). The low-emissivity multilayer stacks may frequently comprise several silver layers, typically two or three. The or each silver layer is generally surrounded by dielectric layers that protect it from corrosion and make it possible to adjust the appearance of the coating in reflection. Molybdenum is frequently used as an electrode material for photovoltaic cells based on $CuIn_xGa_{1-x}Se_2$, where x varies from 0 to 1. The treatment according to the invention makes it possible to reduce its resistivity. Other metals may be treated according to the invention, such as for example titanium, with the aim in particular of oxidizing it and obtaining a photocatalytic titanium oxide layer.

When the coating to be treated is a low-emissivity multilayer stack, it preferably comprises, starting from the substrate, a first coating comprising at least a first dielectric layer, at least a silver layer, optionally an overblocker layer and a second coating comprising at least a second dielectric layer.

Preferably, the physical thickness of the or each silver layer is between 6 and 20 nm.

The overblocker layer is intended to protect the silver layer during the deposition of a subsequent layer (for example if the latter is deposited in an oxidizing or nitriding atmosphere) and during an optional heat treatment of tempering or bending type.

The silver layer may also be deposited on and in contact with an underblocker layer. The multilayer stack can therefore comprise an overblocker layer and/or an underblocker layer flanking the or each silver layer.

Blocker (underblocker and/or overblocker) layers are generally based on a metal chosen from nickel, chromium, titanium, niobium or an alloy of these various metals. Mention may in particular be made of nickel-titanium alloys (especially those containing about 50% of each metal by weight) or nickel-chromium alloys (especially those containing 80% nickel by weight and 20% chromium by weight). The overblocker layer may also consist of several superposed layers; for example, on moving away from the substrate, a titanium layer and then a nickel alloy (especially a nickel-chromium alloy) layer, or vice versa. The various metals or alloys cited may also be partially oxidized, and may especially be substoichiometric in oxygen (for example $TiO_x$ or $NiCrO_x$).

These blocker (underblocker and/or overblocker) layers are very thin, normally having a thickness of less than 1 nm, so as not to affect the light transmission of the multilayer stack, and can be partially oxidized during the heat treatment according to the invention. In general, the blocker layers are sacrificial layers capable of capturing oxygen coming from the atmosphere or from the substrate, thus preventing the silver layer from oxidizing.

The first and/or the second dielectric layer is typically an oxide (especially tin oxide), or preferably a nitride, especially silicon nitride (in particular in the case of the second dielectric layer, the one further away from the substrate). In general, the silicon nitride may be doped, for example with aluminum or boron, so as to make it easier to deposit it by sputtering techniques. The degree of doping (corresponding to the atomic percentage relative to the amount of silicon) generally does not exceed 2%. The function of these dielectric layers is to protect the silver layer from chemical or mechanical attack and they also influence the optical properties, especially in reflection, of the multilayer stack, through interference phenomena.

The first coating may comprise one dielectric layer or several, typically 2 to 4, dielectric layers. The second coating may comprise one dielectric layer or several, typically 2 to 3, dielectric layers. These dielectric layers are preferably made of a material chosen from silicon nitride, titanium oxide, tin oxide and zinc oxide, or any mixture or solid solution thereof, for example a tin zinc oxide, or a titanium zinc oxide. The physical thickness of the dielectric layer, or the overall physical thickness of all the dielectric layers, whether in the first coating or in the second coating, is preferably between 15 and 60 nm, especially between 20 and 50 nm.

The first coating preferably comprises, immediately beneath the silver layer or beneath the optional underblocker layer, a wetting layer, the function of which is to increase the wetting and bonding of the silver layer. Zinc oxide, especially when doped with aluminum, proves to be particularly advantageous in this regard.

The first coating may also contain, directly beneath the wetting layer, a smoothing layer, which is a partially or completely amorphous mixed oxide (and therefore one having a very low roughness), the function of which is to promote growth of the wetting layer in a preferential crystallographic orientation, thereby promoting silver crystallization through epitaxial phenomena. The smoothing layer is preferably composed of a mixed oxide of at least two metals chosen from Sn, Zn, In, Ga and Sb. A preferred oxide is antimony-doped indium tin oxide.

In the first coating, the wetting layer or the optional smoothing layer is preferably deposited directly on the first dielectric layer. The first dielectric layer is preferably deposited directly on the substrate. For optimally adapting the optical properties (especially the appearance in reflection) of the multilayer stack, the first dielectric layer may as an alternative be deposited on another oxide or nitride layer, for example a titanium oxide layer.

Within the second coating, the second dielectric layer may be deposited directly on the silver layer or preferably on an overblocker, or else on other oxide or nitride layers intended for adapting the optical properties of the multilayer stack. For example, a zinc oxide layer, especially one doped with aluminum, or a tin oxide layer, may be placed between an overblocker and the second dielectric layer, which is preferably made of silicon nitride. Zinc oxide, especially aluminum-doped zinc oxide, helps to improve the adhesion between the silver and the upper layers.

Thus, the multilayer stack treated according to the invention preferably comprises at least one ZnO/Ag/ZnO succession. The zinc oxide may be doped with aluminum. An underblocker layer may be placed between the silver layer and the subjacent layer. Alternatively or additionally, an overblocker layer may be placed between the silver layer and the superjacent layer.

Finally, the second coating may be surmounted by an overlayer, sometimes referred to as an overcoat in the art. This last layer of the multilayer stack, which is therefore the one in contact with the ambient air, is intended to protect the multilayer stack from any mechanical attack (scratches, etc.) or chemical attack. This overcoat is generally very thin so as not to disturb the appearance in reflection of the multilayer stack (its thickness is typically between 1 and 5 nm). It is preferably based on titanium oxide or a mixed tin zinc oxide, especially one doped with antimony, deposited in substoichiometric form.

The multilayer stack may comprise one or more silver layers, especially two or three silver layers. Where more than one silver layer is present, the general architecture presented above may be repeated. In this case, the second coating relating to a given silver layer (and therefore located above this silver layer) generally coincides with the first coating relating to the next silver layer.

The thin layers based on titanium oxide have the distinctive feature of being self-cleaning, by facilitating the degradation of organic compounds under the action of ultraviolet radiation and the removal of mineral soiling (dust) under the action of water runoff. Their physical thickness is preferably between 2 and 50 nm, in particular between 5 and 20 nm, limits included.

The various layers mentioned have the common distinctive feature of seeing some of their properties improved when they are in an at least partially crystallized state. It is generally sought to maximize the degree of crystallization of these layers (the proportion of crystallized material by weight or by volume) and the size of the crystalline grains (or the size of the coherent diffraction domains measured by X-ray diffraction methods), or even in certain cases to favor a particular crystallographic form.

In the case of titanium oxide, it is known that titanium oxide crystallized in anatase form is much more effective in terms of degradation of organic compounds than amorphous titanium oxide or titanium oxide crystallized in rutile or brookite form.

It is also known that the silver layers having a high degree of crystallization and consequently a low residual content of amorphous silver have a lower emissivity and a lower resistivity than predominantly amorphous silver layers. The electrical conductivity and the low-emissivity properties of these layers are thus improved.

Similarly, the aforementioned transparent conductive layers, especially those based on doped zinc oxide, fluorine-doped tin oxide or tin-doped indium oxide, have an even higher electrical conductivity when their degree of crystallization is high.

Preferably, when the coating is conductive, its sheet resistance is reduced by at least 10%, or 15% or even 20% by the heat treatment. Here this is a question of a relative reduction, with respect to the value of the sheet resistance before treatment.

Other coatings may be treated according to the invention. Mention may especially be made, non-limitingly, of coatings based on (or consisting of) CdTe or chalcopyrites, for example of $CuIn_xGa_{1-x}Se_2$ type, where x varies from 0 to 1. Mention may also be made of coatings of enamel type (for example deposited by screenprinting), or of paint or lacquer type (typically comprising an organic resin and pigments).

The coated substrates obtained according to the invention may be used in single, multiple or laminated glazing, mirrors, and glass wall coverings. If the coating is a low-emissivity multilayer stack, and in the case of multiple glazing comprising at least two glass sheets separated by a gas-filled cavity, it is preferable for the multilayer stack to be placed on the side in contact with said gas-filled cavity, especially on side 2 relative to the outside (i.e. on that side of the substrate in contact with the outside of the building which is on the opposite side to the side turned toward the outside) or on side 3 (i.e. on that side of the second substrate starting from the outside of the building turned toward the outside). If the coating is a photocatalytic layer, it is preferably placed on side 1, therefore in contact with the outside of the building.

The coated substrates obtained according to the invention may also be used in photovoltaic cells or glazing or solar panels, the coating treated according to the invention being, for example, an electrode based on ZnO:Al or ZnO:Ga in multilayer stacks based on chalcopyrites (in particular of CIGS type, i.e. $CuIn_xGa_{1-x}Se_2$, x varying from 0 to 1) or based on amorphous and/or polycrystalline silicon, or else based on CdTe.

The coated substrates obtained according to the invention may also be used in display screens of the LCD (Liquid Crystal Display), OLED (Organic Light-Emitting Diode) or FED (Field Emission Display) type, the coating treated according to the invention being, for example, an electrically conductive layer of ITO. They may also be used in electrochromic glazing, the thin layer treated according to the invention being, for example, a transparent electrically conductive layer, as taught in application FR-A-2 833 107.

The invention is illustrated with the aid of the following nonlimiting exemplary embodiments.

EXAMPLE 1

A low-emissivity multilayer stack containing a silver layer is deposited by magnetron sputtering on a 4 mm thick clear glass substrate, the surface area of which is 600×3210 $cm^2$.

Table 1 below indicates the physical thickness of each of the layers of the multilayer stack, expressed in nm. The first line corresponds to the layer furthest from the substrate, in contact with the open air.

TABLE 1

| | |
|---|---|
| $ZnSnSbO_x$ | 2 |
| $Si_3N_4$:Al | 43 |
| ZnO:Al | 5 |
| Ti | 0.5 |
| Ag | 15 |
| ZnO:Al | 5 |
| $TiO_2$ | 11 |
| $Si_3N_4$:Al | 14 |

Table 2 below summarizes the deposition parameters used for the various layers.

TABLE 2

| Layer | Target used | Deposition pressure | Gas |
|---|---|---|---|
| $Si_3N_4$ | Si:Al at 92:8 wt % | $1.5 \times 10^{-3}$ mbar | $Ar/(Ar + N_2)$ at 45% |
| $TiO_2$ | $TiO_x$ with x of the order of 1.9 | $1.5 \times 10^{-3}$ mbar | $Ar/(Ar + O_2)$ at 95% |
| $ZnSnSbO_x$ | SnZn:Sb at 34:65:1 wt % | $2 \times 10^{-3}$ mbar | $Ar/(Ar + O_2)$ at 58% |
| ZnO:Al | Zn:Al at 98:2 wt % | $2 \times 10^{-3}$ mbar | $Ar/(Ar + O_2)$ at 52% |
| Ti | Ti | $2 \times 10^{-3}$ mbar | Ar |
| Ag | Ag | $2 \times 10^{-3}$ mbar | Ar at 100% |

The substrate is then heat-treated using eleven laser lines having a length of 30 cm, positioned so that the entire width of the substrate is treated. The laser sources are laser diodes that emit a continuous radiation, the wavelength of which is 915 nm or 980 nm, in the form of a line focused on the coating.

The substrate coated with its multilayer stack is positioned on a roller conveyor, level with the focal plane of each laser line, and runs under each laser line at a speed of 5 m/min, the speed not varying by more than 1% in relative terms.

During operation, the linear power density of each laser line is 400 W/cm, the mean width of each line is 53 micrometers, and the beam quality factor (beam parameter product) is 2.5 mm·mrad.

In this way, the width of each laser line varies by at most 10% in relative terms when the distance from the coating to the focal plane of the laser varies by ±0.5 mm.

Moreover, the width of each line is homogeneous over the length of each of the lines so that, for each line, the difference between the largest width and the smallest width is equal to 3% of the mean value (i.e. 1.5 micrometers).

The coating is treated very homogeneously, the sheet resistance of the coating decreasing from 18% to 21% in relative terms at any point of the coating, without generation of optical defects.

EXAMPLE 2

This example differs from example 1 in that use is made of fifteen laser lines having a length of 22 cm, juxtaposed so as to form a single line having a length of 3.3 m. The linear power density of each laser line is 500 W/cm, the mean width of each line is 50 micrometers, and the beam quality factor is 1.1 mm·mrad. In this way, the width of each laser line varies by at most 10% in relative terms when the distance from the coating to the focal plane of the laser varies by ±1 mm. Here too the treatment is again very homogeneous, the coating not having any optical defect.

COMPARATIVE EXAMPLE 1

This comparative example differs from example 1 in that the beam quality factor is 6.2 mm·mrad.

In this case, the width of each laser line varies by around 50% in relative terms when the distance from the coating to the focal plane of the laser varies by ±0.5 mm.

After treatment it is observed that the loss of sheet resistance is not homogeneous over the entire surface of the substrate. Although at certain locations it reaches 20% to 21%, it is only 3% in certain zones of the substrate due to variations in the distance between the substrate and the focal plane generated by the flatness defects of the substrate and the conveying thereof at high speed.

COMPARATIVE EXAMPLE 2

This example differs from example 2 in that the beam quality factor is 4 mm·mrad.

In this case, the width of each laser line varies by around 90% in relative terms when the distance from the coating to the focal plane of the laser varies by ±1 mm.

As for comparative example 1, the loss of sheet resistance is not homogeneous.

COMPARATIVE EXAMPLE 3

This example differs from example 1 in that the linear power density is 180 W/cm. In this case, the loss of sheet resistance due to the treatment is too low since the coating does not reach the appropriate temperatures that enable the crystallization thereof.

In order to be able to reach the desired temperatures, it is necessary to reduce the mean width of each line to 11 micrometers. In this case however, the width of each laser line varies by a factor of 10 when the distance from the coating to the focal plane of the laser varies by ±0.5 mm. Taking into account the flatness defects of the large-sized substrate, the conveying thereof, and vibrations, the treatment is then not homogeneous, the loss of sheet resistance varying significantly as a function of the zones of the surface of the substrate.

COMPARATIVE EXAMPLE 4

This example differs from example 2 in that the linear power density is 180 W/cm. In this case too, the loss of sheet resistance due to the treatment is too low since the coating does not reach the appropriate temperatures that enable the crystallization thereof.

In order to be able to reach the desired temperatures, it is necessary to reduce the mean width of each line to 7 micrometers. In this case however, the width of each laser line varies by a factor of 22 when the distance from the coating to the focal plane of the laser varies by ±1 mm. Taking into account the flatness defects of the large-sized substrate, the conveying thereof, and vibrations, the treatment is then not homogeneous, the loss of sheet resistance varying significantly as a function of the zones of the surface of the substrate.

COMPARATIVE EXAMPLE 5

This example differs from example 1 in that each line is not homogeneous in terms of width. Although the mean width is still 53 micrometers, the width distribution is such that the difference between the largest width and the smallest width is equal to 13 micrometers, i.e. 25% of the mean value. The treatment is then heterogeneous: the layer is locally degraded due to an over-intensity of the laser treatment (in the zones where the width of the line is smallest), leading both to the appearance of isolated optical defects that are visually unacceptable, and an overall loss of sheet resistance of only 13% to 14% in relative terms.

The invention claimed is:

1. A process for obtaining a substrate provided, on at least one portion of at least one side, with a heat-treated coating, the process comprising:

heat treating a coating provided on at least one portion of at least one side of said substrate with a pulsed or continuous laser radiation focused on said coating as a laser line provided by a plurality of lasers positioned to form the laser line having a cumulative laser length, wherein, in the heat treating, said substrate is substantially horizontal and travels on a conveyor facing the laser line, wherein the heat treating substantially homogeneously treats the substrate while tolerating a variation in distance to the laser focal spot due to vibrations of the substrate while the speed of travel of the substrate is at least 3 meters per minute, wherein, in the heat treating, the laser line has a combination of a wavelength within a range of 400 to 1500 nm, a beam parameter product (BPP) of at most 3 mm·mrad, measured at a place where the laser line is focused on said coating, a linear power density divided by the square root of a duty cycle within a range from 200 W/cm to 1000 W/cm, a length within a range of 20 cm to 100 cm, a mean width within a range of 40 to 100 micrometers, wherein a width of the laser line remains essentially constant throughout said heat treating such that a difference between a largest width and a smallest width of the laser line is at most 10% of the mean width when the displacement distance from the coating to the focal plane of the laser varies between ±1 mm, and wherein the temperature reached by said coating at each point during said heat treating does not vary by more than 10% in relative terms compared to the targeted temperature when the displacement distance from the coating to the focal plane of the laser varies between ±1 mm.

2. The process as claimed in claim 1, wherein
the laser line is fixed and positioned substantially perpendicular to a direction of travel.

3. The process as claimed in claim 1, wherein the wavelength of the radiation of the laser line is within a range of from 800 to 1000 nm.

4. The process as claimed in claim 1, wherein the laser radiation is continuous.

5. The process as claimed in claim 1, wherein the linear power density divided by the square root of the duty cycle is within a range of 400 to 500 W/cm.

6. The process as claimed in claim 1, wherein the mean width of the laser line is within a range of 50 to 53 micrometers.

7. The process as claimed in claim 1, wherein the length of the laser line is at least 20 cm.

8. The process as claimed in claim 1, wherein an energy density provided to the coating divided by the square root of the duty cycle is at least 20 J/cm$^2$.

9. The process as claimed in claim 1, wherein the substrate comprises glass or a polymeric organic material.

10. The process as claimed in claim 1, wherein the substrate has at least one dimension greater than 1 m.

11. The process as claimed in claim 1, wherein the coating comprises a metallic layer, a titanium oxide layer, a transparent electrically conductive layer, or any combination thereof.

12. The process as claimed in claim 1, wherein the heat treating is at a temperature of at least 300° C.

13. The process as claimed in claim 1, wherein a temperature of a side of the substrate opposite a side treated by the laser radiation does not exceed 100° C. during the heat treatment.

14. The process of claim 11, wherein the coating comprises a silver or molybdenum layer as a metallic layer.

15. The process as claimed in claim 1, wherein the laser line has a beam parameter product (BPP) of at most 2.6 mm·mrad.

16. The process as claimed in claim 1, wherein the laser line has a beam parameter product (BPP) of at most 2 mm·mrad, the difference between the largest width and the smallest width of the laser line is at most 10% of the mean width, and the temperature reached by said coating at each point during said heat treating does not vary by more than 10% in relative terms.

17. The process as claimed in claim 1, wherein the laser line has a beam parameter product (BPP) of at most 1.5 mm·mrad, the difference between the largest width and the smallest width of the laser line is at most 5% of the mean width, and the temperature reached by said coating at each point during said heat treating does not vary by more than 5% in relative terms.

18. The process as claimed in claim 1, wherein the laser line has a beam parameter product (BPP) of at most 1 mm·mrad.

19. The process as claimed in claim 1, wherein the laser line has a beam parameter product (BPP) of at most 0.7 mm·mrad.

20. The process as claimed in claim 1, wherein the targeted temperature is at least 300° C.

21. A process for obtaining a substrate provided, on at least one portion of at least one side, with a heat-treated coating, the process comprising:
heat treating a coating provided on at least one portion of at least one side of said substrate with a pulsed or continuous laser radiation focused on said coating as a laser line provided by a plurality of lasers positioned to form the laser line having a cumulative laser length,
wherein, in the heat treating, said substrate is substantially horizontal and travels on a conveyor facing the laser line,
wherein the heat treating substantially homogeneously treats the substrate while tolerating, relative displacement distance between the coating and the focal plane of the laser line varies based on a variation in distance to the laser focal spot due to vibrations of the substrate while the speed of travel of the substrate is at least 3 meters per minute,
wherein, in the heat treating, the laser line has a combination of
a wavelength of 915 or 980 nm,
a beam parameter product (BPP) of 2.5 mm·mrad,
measured at a place where the laser line is focused on said coating, a linear power density divided by the square root of a duty cycle is 400 W/cm,
a length within a range of approximately 30 cm,
a mean width is 53 micrometers,
wherein the homogeneous treatment is such that a width of the laser line remains essentially constant throughout said heat treating such that a difference between a largest width and a smallest width of the laser line is at most 10% of the mean width when the displacement distance from the coating to the focal plane of the laser varies between ±0.5 mm, and
wherein the homogeneous treatment is such that the sheet resistance of the coating decreases from 18% to 21% at any point of the coating.

22. A process for obtaining a substrate provided, on at least one portion of at least one side, with a heat-treated coating, the process comprising:
heat treating a coating provided on at least one portion of at least one side of said substrate with a pulsed or continuous laser radiation focused on said coating as a laser line provided by a plurality of lasers positioned to form the laser line having a cumulative laser length,
wherein, in the heat treating, said substrate is substantially horizontal and travels on a conveyor facing the laser line,
wherein the heat treating substantially homogeneously treats the substrate while tolerating, relative displacement distance between the coating and the focal plane of the laser line varies based on a variation in distance to the laser focal spot due to vibrations of the substrate while the speed of travel of the substrate is at least 3 meters per minute,
wherein, in the heat treating, the laser line has a combination of
a wavelength of 915 or 980 nm,
a beam parameter product (BPP) of 1.1 mm·mrad,
measured at a place where the laser line is focused on said coating, a linear power density divided by the square root of a duty cycle of 500 W/cm,
a length of approximately 22 cm,
a mean width of 50 micrometers,
wherein the homogeneous treatment is such that a width of the laser line remains essentially constant throughout said heat treating such that a difference between a largest width and a smallest width of the laser line is at most 10% of the mean width when the displacement distance from the coating to the focal plane of the laser varies between ±1 mm.

* * * * *